(12) United States Patent
Perng et al.

(10) Patent No.: US 8,525,328 B2
(45) Date of Patent: Sep. 3, 2013

(54) POWER DEVICE PACKAGE STRUCTURE

(75) Inventors: Jiin-Shing Perng, Hsinchu County (TW); Min-Lin Lee, Hsinchu (TW); Shinn-Juh Lai, Hsinchu County (TW); Huey-Ru Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 90 days.

(21) Appl. No.: 13/182,469

(22) Filed: Jul. 14, 2011

(65) Prior Publication Data

US 2012/0168839 A1 Jul. 5, 2012

(30) Foreign Application Priority Data

Dec. 30, 2010 (TW) .............................. 99146763 A

(51) Int. Cl.
*H01L 23/34* (2006.01)

(52) U.S. Cl.
USPC .................................. 257/724; 257/E23.001

(58) Field of Classification Search
USPC .................................. 257/691, 724, E23.001
See application file for complete search history.

(56) References Cited

U.S. PATENT DOCUMENTS

| | | | |
|---|---|---|---|
| 4,949,213 A | 8/1990 | Sasagawa et al. |
| 5,319,301 A | 6/1994 | Callahan et al. |
| 5,537,074 A | 7/1996 | Iversen et al. |
| 5,543,659 A | 8/1996 | Hosen |
| 5,545,955 A | 8/1996 | Wood |
| 5,550,436 A | 8/1996 | Houk |
| 5,559,394 A | 9/1996 | Wood |
| 5,596,466 A | 1/1997 | Ochi |
| 5,629,607 A | 5/1997 | Callahan et al. |
| 5,729,450 A | 3/1998 | Dimino et al. |
| RE35,807 E | 5/1998 | Iversen et al. |
| 5,747,943 A | 5/1998 | Houk et al. |
| 5,757,141 A | 5/1998 | Wood |
| 5,757,599 A | 5/1998 | Crane |
| 5,874,826 A | 2/1999 | Chen et al. |
| 5,892,673 A | 4/1999 | Delgado et al. |
| 5,892,677 A | 4/1999 | Chang |
| 5,914,577 A | 6/1999 | Furnival |
| 5,932,974 A | 8/1999 | Wood |
| 5,995,349 A | 11/1999 | Temple |
| 6,002,183 A | 12/1999 | Iversen et al. |
| 6,002,213 A | 12/1999 | Wood |
| 6,038,155 A | 3/2000 | Pelly |
| 6,060,795 A | 5/2000 | Azotea et al. |
| 6,084,790 A | 7/2000 | Wong |
| 6,101,114 A | 8/2000 | Kijima et al. |
| 6,160,326 A | 12/2000 | Iversen et al. |
| 6,323,717 B1 | 11/2001 | Omura et al. |
| 6,337,801 B2 | 1/2002 | Li et al. |

(Continued)

OTHER PUBLICATIONS

Omura et al, IGBT Negative Gate Capacitance and Related Instability Effects, IEEE Electron Device Letters, vol. 18, No. 12, Dec. 1997, pp. 622-624.

(Continued)

*Primary Examiner* — William D Coleman
(74) *Attorney, Agent, or Firm* — Jianq Chyun IP Office

(57) ABSTRACT

The disclosure relates to a power device package structure. By employing the metal substrate of the power device package structure serve as a bottom electrode of a capacitor, the capacitor is integrated into the power device package structure. A dielectric material layer and a upper metal layer sequentially disposed on the metal substrate.

14 Claims, 15 Drawing Sheets

(56) References Cited

U.S. PATENT DOCUMENTS

| | | |
|---|---|---|
| 6,438,002 B2 | 8/2002 | Alhoussami |
| 6,462,976 B1 | 10/2002 | Olejniczak et al. |
| 6,466,455 B2 | 10/2002 | Kirbie |
| 6,529,387 B2 | 3/2003 | Kirbie |
| 6,556,461 B1 | 4/2003 | Khersonsky et al. |
| 6,630,711 B2 | 10/2003 | Huang |
| 6,654,260 B2 | 11/2003 | Okayama et al. |
| 6,657,874 B2 | 12/2003 | Yu |
| 6,744,644 B2 | 6/2004 | Kojori |
| 6,803,746 B2 | 10/2004 | Aker et al. |
| 6,972,972 B2 | 12/2005 | Duncan et al. |
| 7,180,759 B2 | 2/2007 | Liptak et al. |
| 7,271,564 B2 | 9/2007 | Ramu |
| 7,301,308 B2 | 11/2007 | Aker et al. |
| RE41,040 E | 12/2009 | Khersonsky et al. |
| 7,643,296 B2 | 1/2010 | Yamada et al. |
| 7,692,211 B1 | 4/2010 | Temple et al. |
| 7,880,282 B2 * | 2/2011 | Holland .................. 257/678 |
| 2006/0072259 A1 * | 4/2006 | Yunus .................. 361/56 |
| 2007/0164409 A1 | 7/2007 | Holland |
| 2010/0044845 A1 * | 2/2010 | Funaya et al. ............ 257/685 |

OTHER PUBLICATIONS

Linder et al., A New Range of Reverse Conducting Gate-Commutated Thyristors for High-Voltage, Medium Power Applications, ABBS Semiconductors AG Conference Proceedings, Sep. 8-10, 1997, pp. 1-8.

Nakagawa et al., Experimental and Numerical Study of Non-Latch-Up Bipolar-Mode MOSFET Characteristics, IEDM 1985, pp. 150-154.

Xing et al., Extraction of Parasitics within Wire-Bond IGBT Modules, IEEE 1998, pp. 497-503.

Alderman et al., Power Supply on Chip (PwrSoC) Update 2010, APEC 2010, Feb. 25, 2010, pp. 1-24.

"Office Action of Taiwan counterpart application" issued on May 3, 2013, p. 1-7.

* cited by examiner

POWER DEVICE PACKAGE STRUCTURE

CROSS-REFERENCE TO RELATED APPLICATION

This application claims the priority benefit of Taiwan application serial no. 99146763, filed Dec. 30, 2010. The entirety of the above-mentioned patent application is hereby incorporated by reference herein and made a part of this specification.

BACKGROUND

1. Technical Field

The disclosure generally relates to a power device package structure. More particularly, the disclosure relates to a package structure incorporating the capacitor and/or resistor with the power device.

2. Technical Art

For the conventional package structure shown in FIG. 1, the package structure includes a metal base plate 28B, a power device 20 and a package resin 23. The metal base plate 28B has a locking area 21 and a central planar area 22. The locking area 21 having a hole 26 is exposed out of the package resin 23, while the package structure can be locked, via the hole 26, to the printed circuit board, a base or other metal heat sinks for heat dissipation. A central metal lead D is extended from the central planar area 22 of the metal base plate 28B, while a first metal lead G and a second metal lead S are respectively arranged coplanarly on both sides of the central metal lead D. The power device 20 is disposed on the central planar area 22 of the metal base plate 28B and has a gate terminal GT, a drain terminal DT and a source terminal ST electrically connected to the metal leads G, D and S respectively, through wires 24. For the conventional package structure shown in FIG. 1, the three terminals GT, DT and ST are coplanarly arranged. However, for the conventional package structure shown in FIG. 2, the three terminals GT, DT and ST are vertically arranged.

However, the conventional package structure does not include capacitors, and the capacitor is electrically connected with the package structure but arranged outside of the package structure. Such design causes longer metal wires or conductive path between the power device and the capacitor, leading to higher parasite inductance effects and more power consumption.

SUMMARY

The disclosure of an embodiment provide a power device package structure. The power device package structure include a metal base plate, a dielectric material layer disposed on the metal base plate, an upper metal layer disposed on the dielectric material layer and at least a power device disposed on the metal base plate. The upper metal layer, the dielectric material, layer and the metal base plate form a capacitor.

The disclosure of another embodiment provide a power device package structure. The power device package structure include a metal base plate, a dielectric material layer disposed on the metal base plate, an upper metal layer disposed on the dielectric material layer, and at least one power device disposed on the upper metal layer, wherein the upper metal layer, the dielectric material layer and the metal base plate form a capacitor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Common reference numerals are used throughout the drawings and the detailed description to indicate the same elements. The disclosure will be more apparent from the following detailed description taken in conjunction with the accompanying drawings.

DESCRIPTION OF THE EMBODIMENTS

Figure 1:
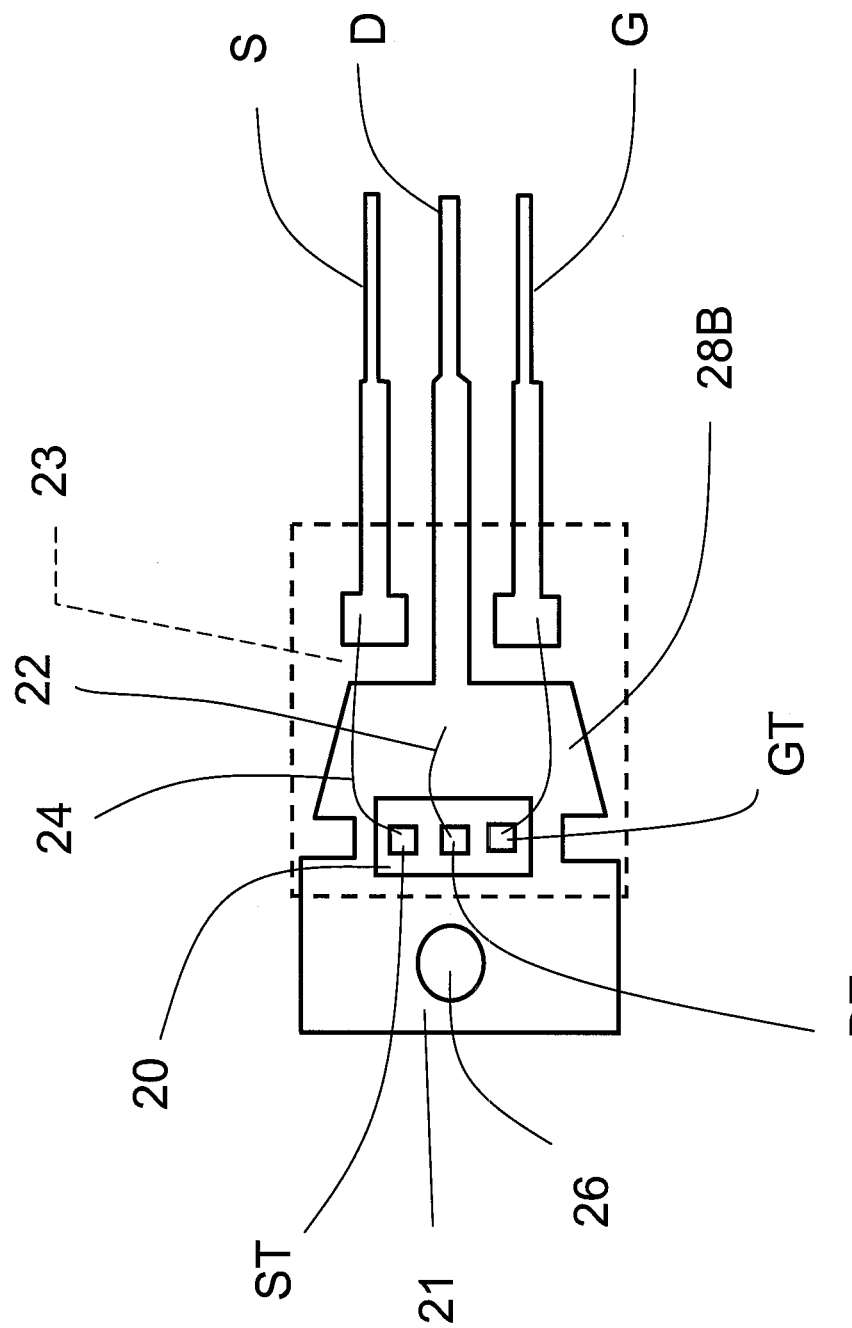
FIG. 1 illustrates a conventional power device package structure.
Figure 2:
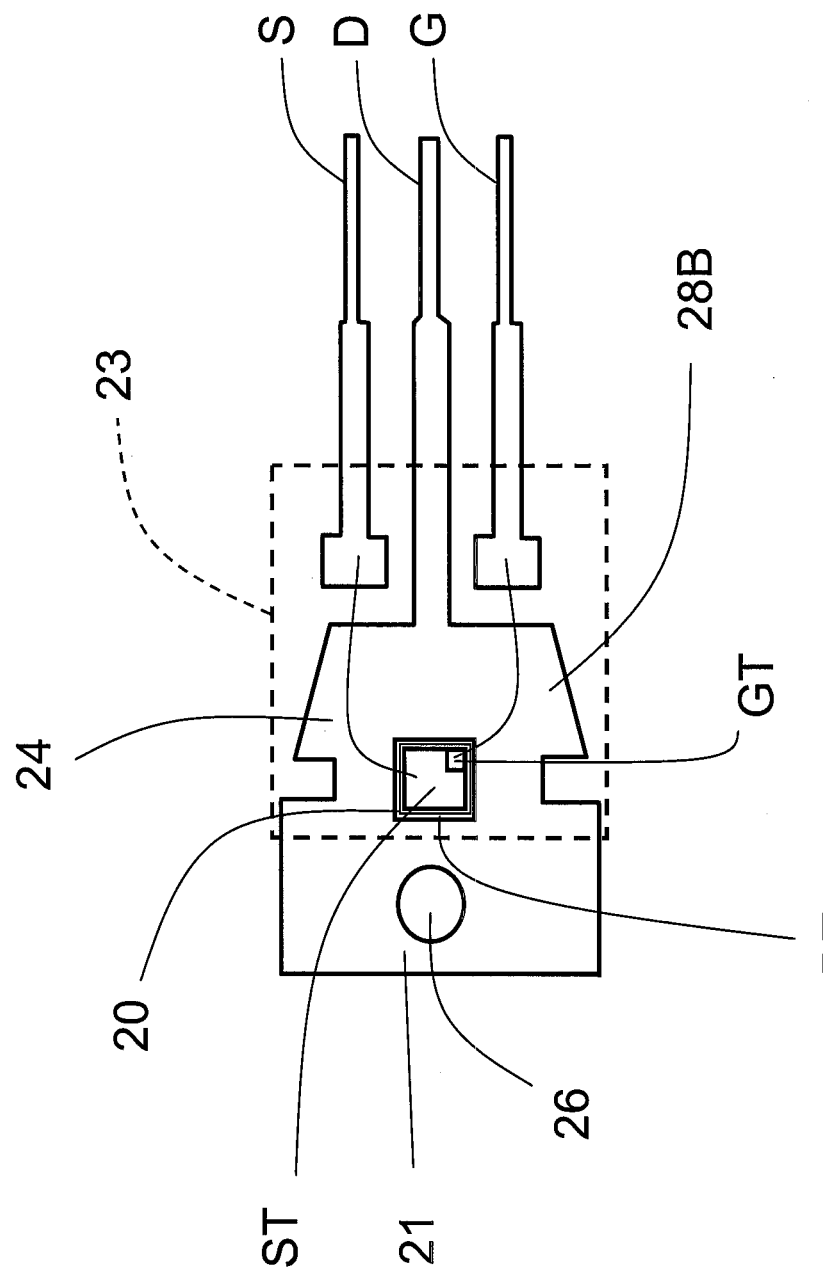
FIG. 2 illustrates a conventional power device package structure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a power device package structure by incorporating the capacitor into the package structure, which reduces the package structure and decreases the production costs. Because the capacitor is located within the package structure, the wiring length between the components can be shortened and the equivalent serial inductance (ESL) and parasite inductance effect can be lessened, along with less power loss.

The disclosure provides a package structure incorporating the capacitor and/or resistor with the power device. As the metal base plate functions as the lower electrode of the capacitor, the capacitor can be formed by arranging a dielectric material layer on the metal base plate and an upper metal layer on the dielectric layer.

The disclosure provides a power device package structure incorporating the capacitor within the package structure. As the metal base plate of the package structure functions as the lower electrode of the capacitor, the capacitor can be formed by arranging a dielectric material layer on the metal base plate and an upper metal layer on the dielectric material layer.

The power device package structure of the disclosure may optionally incorporate one or more resistors on the dielectric material layer of the power device.

Owning to the incorporative design, the wiring length or conductive path between the passive components, such as capacitors or resistors, and the power device can be effectively shortened. Therefore, the parasite inductance effect of the power source transmission loop for the above mentioned components can be lessened. If the RC snubber circuit is directly added to the package structure to flatten the high frequency spike, the IV overlapping area of the IV curve will be decreased. The switch energy (power) loss of the power device is reduced when the overlapping area is reduced.

The power device package structure of the disclosure can lessen the parasite inductance effect and lower the energy loss, which improves the power source transmission efficiency and achieves energy saving.

The power device of the disclosure can be any power device in the electronic or semiconductor industry, and the power device of the disclosure includes, but not limited to, the insulated gate bipolar transistor (IGBT) or metal oxide semiconductor field effect transistor (MOSFET).

Figure 3:
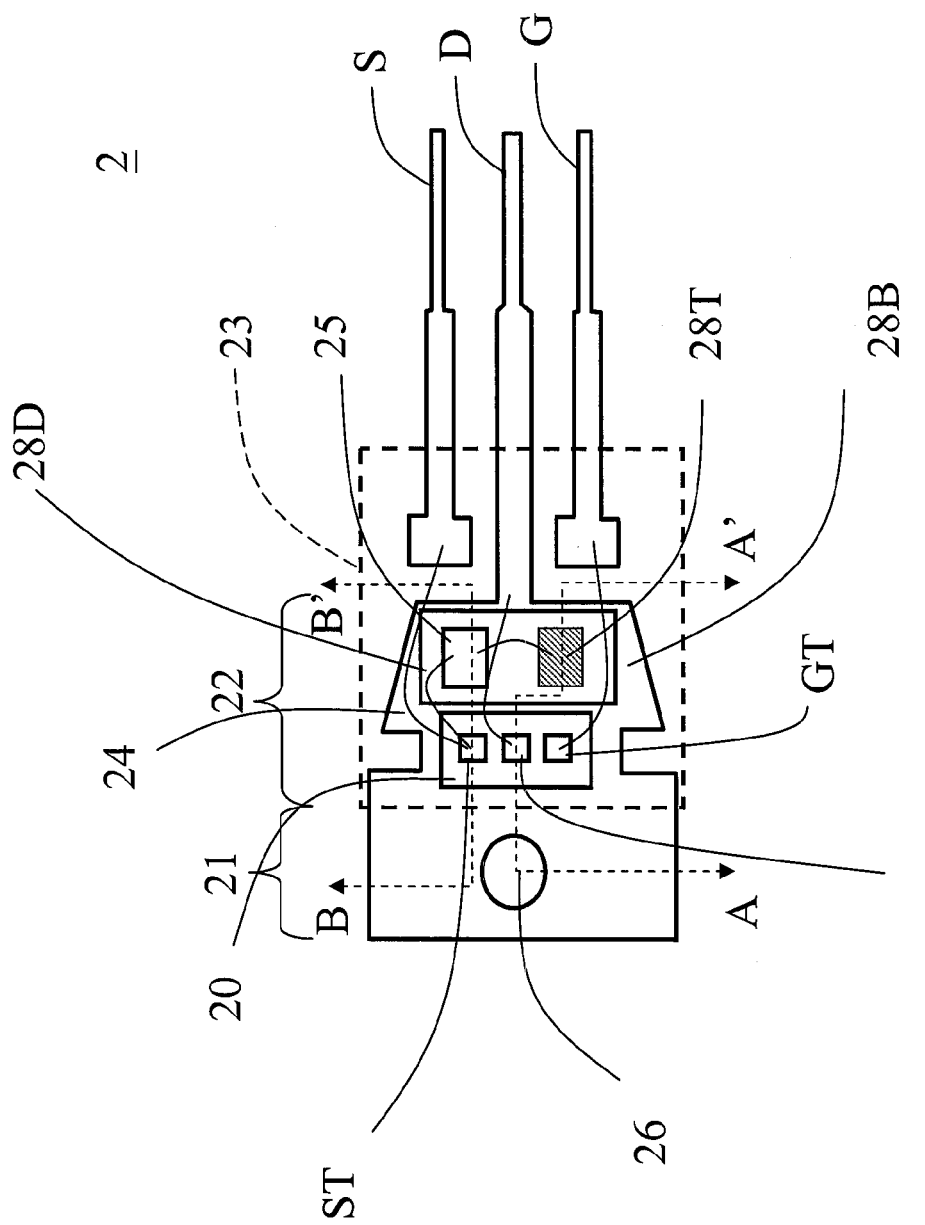
FIG. 3 illustrates an exemplary top view of a power device package structure according to one embodiment of the disclosure.
Figure 4:
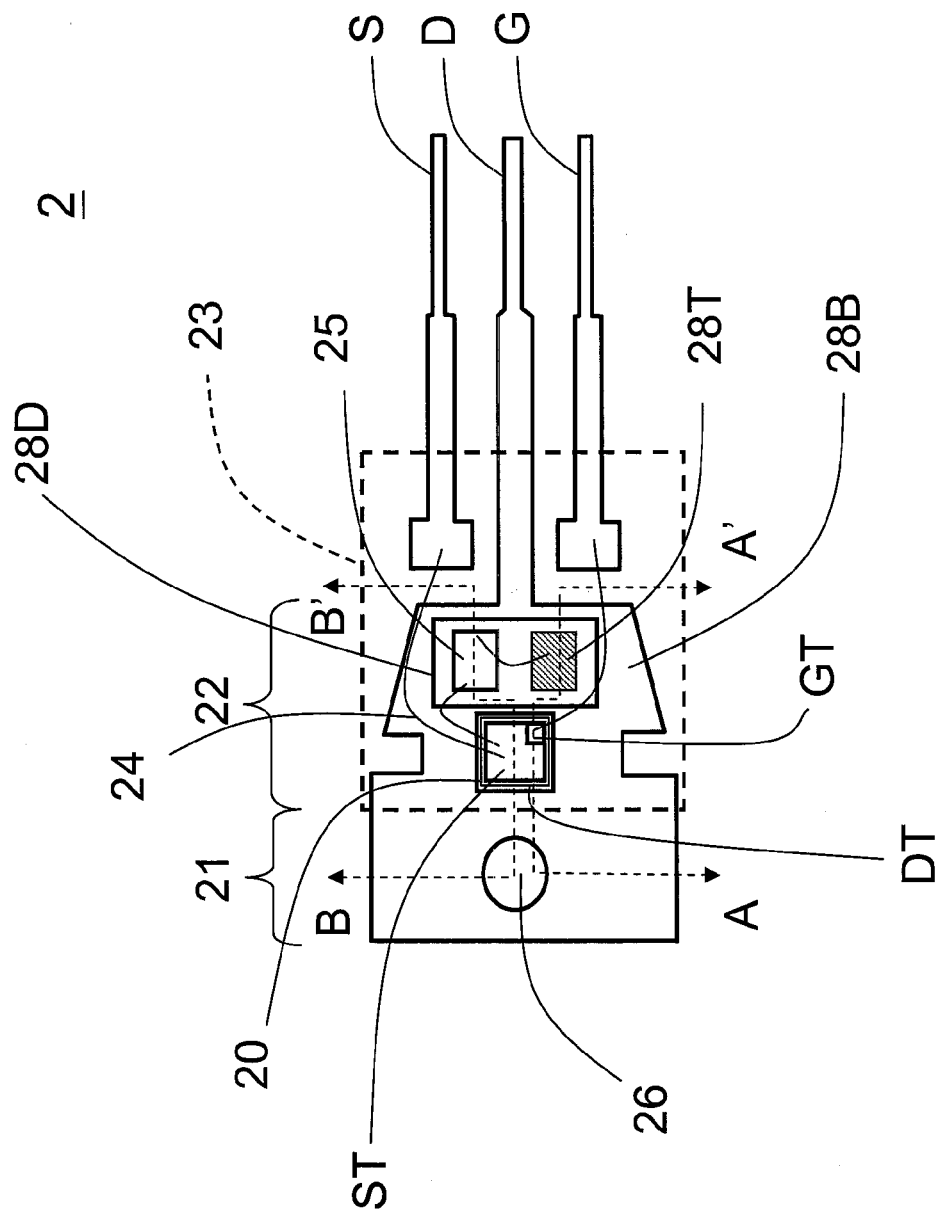
FIG. 4 illustrates an exemplary top view of a power device package structure according to another embodiment of the disclosure.
Figure 6:
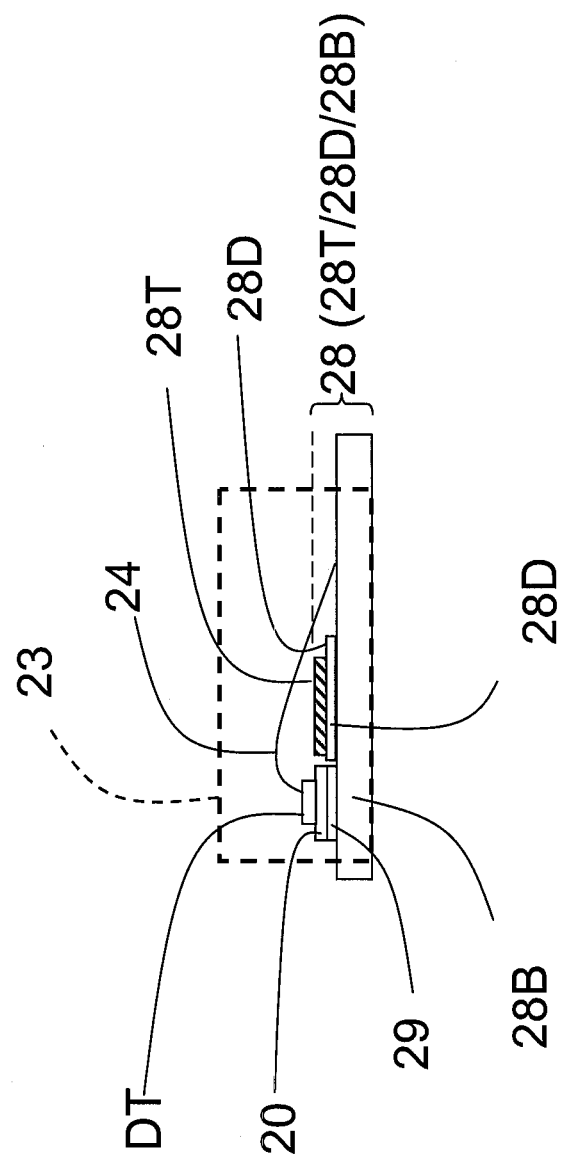
FIG. 6 is shown in a cross-sectional view of FIG. 3 along line A-A'.
Figure 7:
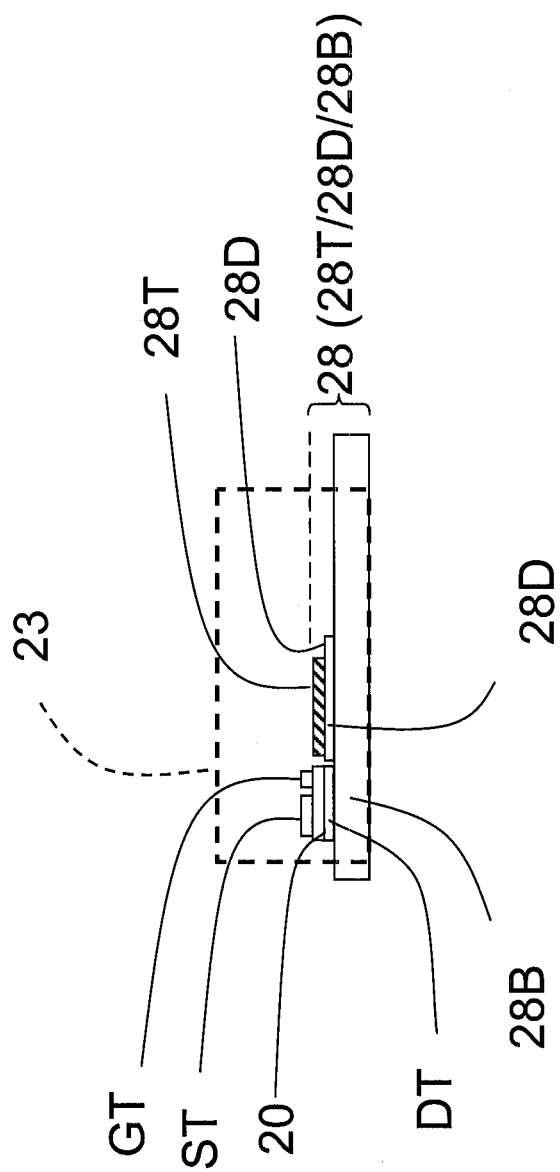
FIG. 7 is shown in a cross-sectional view of FIG. 4 along line A-A'.
Figure 8:
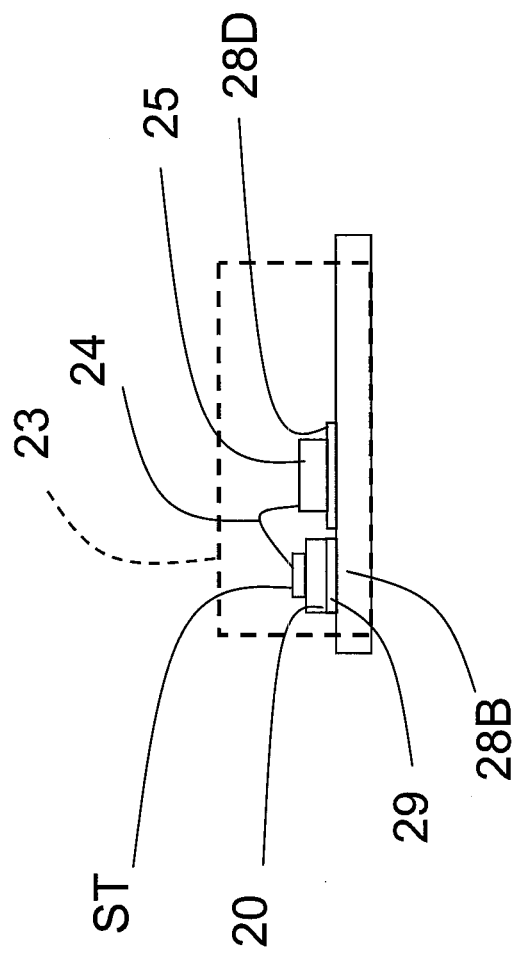
FIG. 8 is shown in a cross-sectional view of FIG. 3 along line B-B'.
Figure 9:
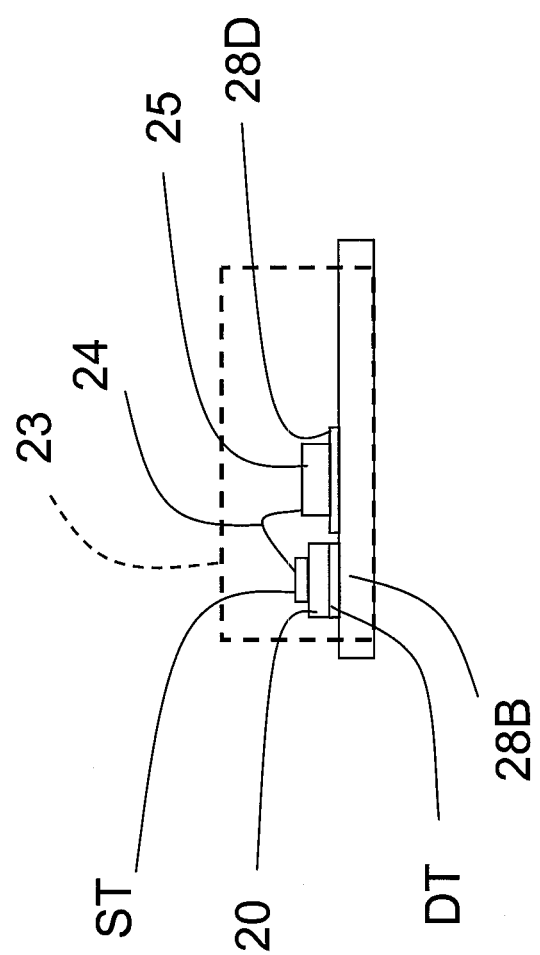
FIG. 9 is shown in a cross-sectional view of FIG. 4 along line B-B'.

FIG. 3 illustrates an exemplary top view of a power device package structure according to one embodiment of the disclosure. FIG. 6 is shown in a cross-sectional view of FIG. 3 along line A-A', while FIG. 8 is shown in a cross-sectional view of FIG. 3 along line B-B'. FIG. 4 illustrates an exemplary top view of a power device package structure according to another embodiment of the disclosure. FIG. 7 is shown in a cross-sectional view of FIG. 4 along line A-A', while FIG. 9 is shown in a cross-sectional view of FIG. 4 along line B-B'.

As shown in FIG. 3 & FIG. 4, the package structure 2 includes at least a power device 20, an package resin 23, a metal base plate 28B, a dielectric material layer 28D and an upper metal layer 28T. The power device 20 is disposed on the metal base plate 28B and is electrically connected to the metal base plate 28B through at least a wire 24. The material of the metal base plate 28B can be aluminum or aluminum alloys, for example. The metal base plate 28B is an integral sheet and has a locking area 21, a central planar area 22 and a central metal lead D. The central planar area 22 is located between the locking area 21 and the central metal lead D. The locking area 21 having a hole 26 is exposed outside of the package resin 23. The package structure 2 can be locked, via the hole 26, to the printed circuit board, a base or other metal heat sinks for heat dissipation. The central metal lead D is protruded from the central planar area 22 of the metal base plate 28B, while a first metal lead G and a second metal lead S are respectively arranged coplanarly on both sides of the central metal lead D. The first metal lead G, second metal lead S and central metal lead D are individual and separate from one another. The package resin 23 covers and protects the components on the metal base plate 28B, and the covering area of the package resin 23 is shown in dotted line in FIG. 3. The material of the package resin 23 can be epoxy resin, for example. The package resin 23 covers and protects the power device 20, the upper metal layer 28T, the resistor 25, the dielectric material layer 28D and the metal wire 24.

The first metal lead G, second metal lead S and central metal lead D respectively function as a gate metal lead, a source metal lead and a drain metal lead.

The power device 20 is disposed on the central planar area 22 of the metal base plate 28B and has a gate terminal GT, a drain terminal DT and a source terminal ST electrically connected to the metal leads G, D and S respectively, through wires 24. The upper surfaces of the first and second metal leads G, S are coplanar with the upper surface of the central metal lead D, while the first and second metal leads G, S are arranged on both sides of the central metal lead D. In FIG. 3, the three terminals GT, DT and ST are coplanarly arranged. However, in FIG. 4, the three terminals GT, DT and ST are coplanarly arranged, or so called vertically arranged. In FIGS. 4, 7 & 9, the terminals GT, ST are arranged on the top of the power device 20, while the terminal DT is arranged in the bottom of the power device 20.

The, number, location or shape of the metal lead(s) shown in this embodiment is not limited by the figures and can be adjusted according to the design of the products and well understood by the artisans.

The dielectric material layer 28D is disposed on the central planar area 22 of the metal base plate 28B, while the upper metal layer 28T is disposed on the dielectric material layer 28D. The resistor 25 can be disposed on the dielectric material layer 28D optionally. The upper metal layer 28T is electrically connected with the resistor 25 through the wire 24, while the resistor 25 is electrically connected to the source terminal ST of the power device 20. The material of the dielectric material layer 28D can be $Al_2O_3$, metalized polypropylene/polypropylene, metalized polyethylene/polyethylene or polyimide, or other applicable materials, for example.

The upper metal layer 28T, the dielectric material layer 28D and the metal base plate 28B together form a capacitor 28. The metal base plate 28B is used as the lower electrode (i.e. the lower metal layer) of the capacitor 28, which reduces the production costs for separately disposing an extra metal layer as the lower metal layer of the capacitor.

The power device 20 and the dielectric material layer 28D are disposed on the planar area 22 of the base plate 28B, while the upper metal layer 28T is located on the dielectric material layer 28D. The dielectric material layer 28D is located beside but separate from the power device 20, while the resistor 25 is located beside but separate from the upper metal layer 28T. The package resin 23 covers and protects the power device 20, the capacitor 28 (including the upper metal layer 28T, the dielectric material layer 28D and the metal base plate 28B) and the resistor 25.

Figure 5:
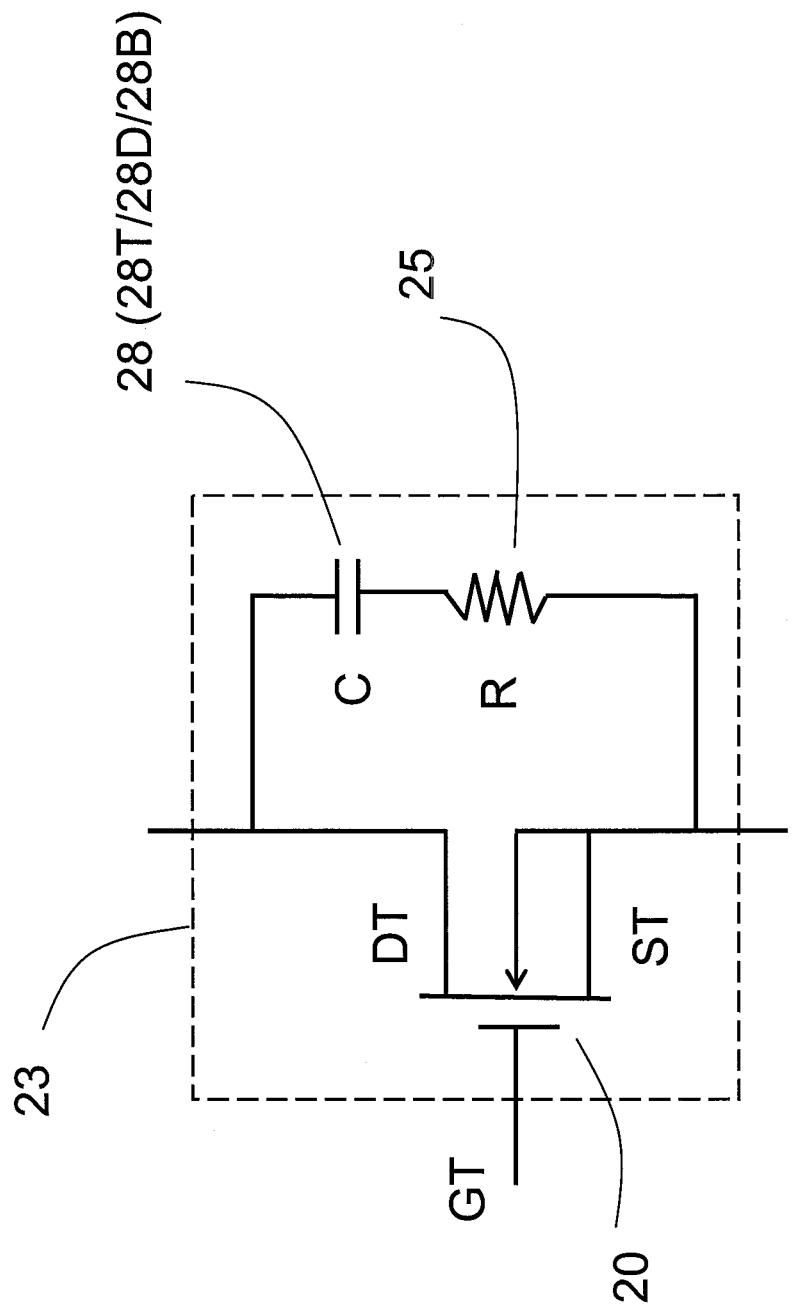
FIG. 5 shows the equivalent circuit of the package structure of FIGS. 3 & 4.

FIG. 5 shows the equivalent circuit of the package structure of FIG. 3 or FIG. 4. One terminal of the capacitor 28 is electrically connected to the drain terminal DT of the power device 20, the other terminal of the capacitor 28 is electrically connected to one terminal of the resistor 25, and the other terminal of the resistor 25 is electrically connected to the source terminal ST of the power device 20.

FIG. 6 is shown in a cross-sectional view of FIG. 3 along line A-A'. FIG. 7 is shown in a cross-sectional view of FIG. 4 along line A-A'. The upper metal layer 28T, the dielectric material layer 28D and the metal base plate 28B together form a capacitor 28. The metal base plate 28B is used as the lower electrode (i.e. the lower metal layer) of the capacitor 28 and the base plate of the package structure 2. The upper metal layer 28T is electrically connected with the resistor 25 through the wire 24, while the metal base plate 28B is electrically connected to the drain terminal DT of the power device 20 through the wire 24.

FIG. 8 is shown in a cross-sectional view of FIG. 3 along line B-B'. FIG. 9 is shown in a cross-sectional view of FIG. 4 along line B-B'. The resistor 25 is located on the dielectric material layer 28D. The resistor 25 is electrically connected with the upper metal layer 28T and the source terminal ST of the power device 20 through the wires 24. The package resin 23 encapsulates the components on the metal base plate 28B.

Figure 10:
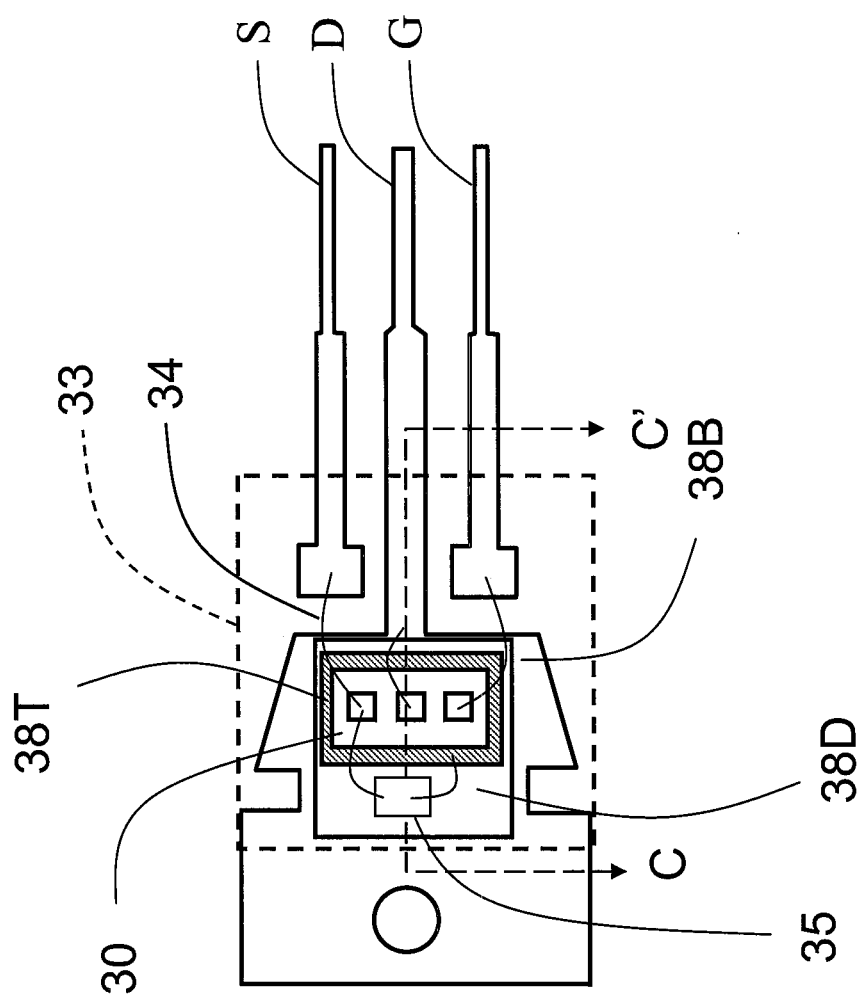
FIG. 10 illustrates an exemplary top view of a power device package structure according to another embodiment of the disclosure.
Figure 11:
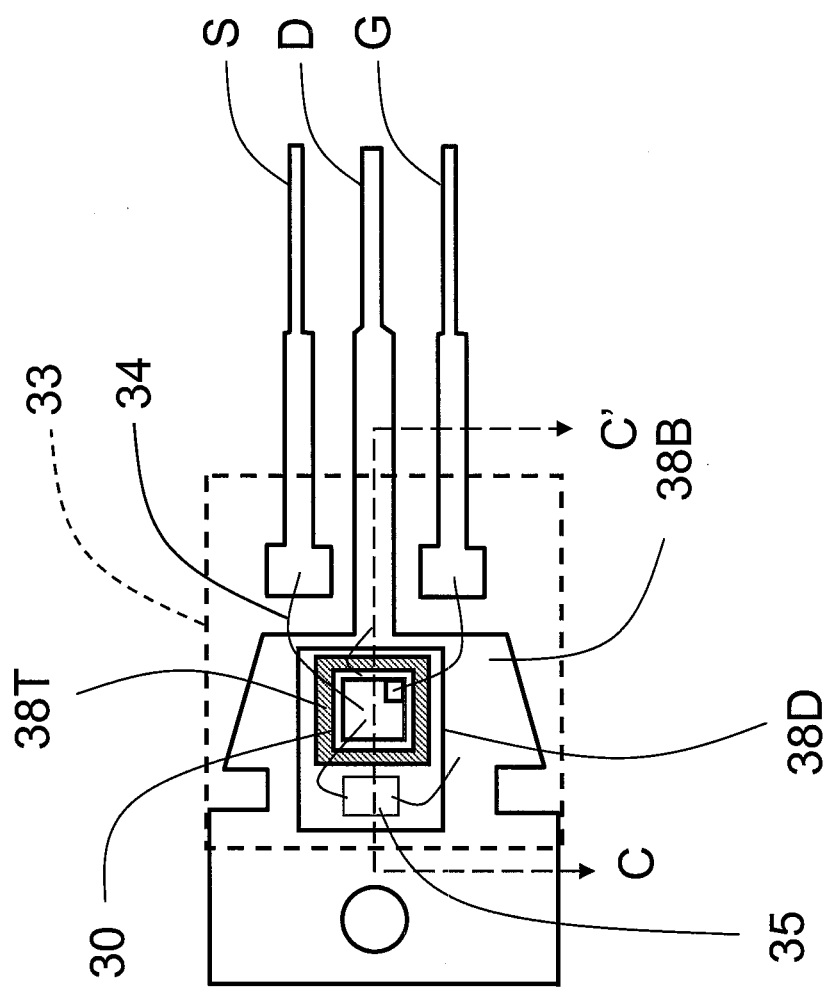
FIG. 11 illustrates an exemplary top view of a power device package structure according to another embodiment of the disclosure.

FIG. 10 illustrates an exemplary top view of a power device package structure according to another embodiment of the disclosure. In this embodiment, the power device 30 is disposed on the upper metal layer 38T. Hence, the resistor 35 can be arranged beside the upper metal layer 38T, and the resistor 35 and the upper metal layer 38T are both located on the dielectric material layer 38D. The capacitor 38 consisting of the upper metal layer 38T, the dielectric material layer 38D and the metal base plate 38B is located below the power device 30. The metal base plate 38B functions as the lower electrode (i.e. the lower metal layer) of the capacitor 38 and as the base of the package structure 3. The dielectric material layer 38D is disposed on the central planar area of the metal base plate 38B. The package structure shown in FIG. 11 is similar to the package structure of FIG. 10, except the three terminals GT, DT and ST are vertically arranged. The three terminals GT, DT and ST are coplanarly arranged for the package structure of FIG. 10.

Figure 12:
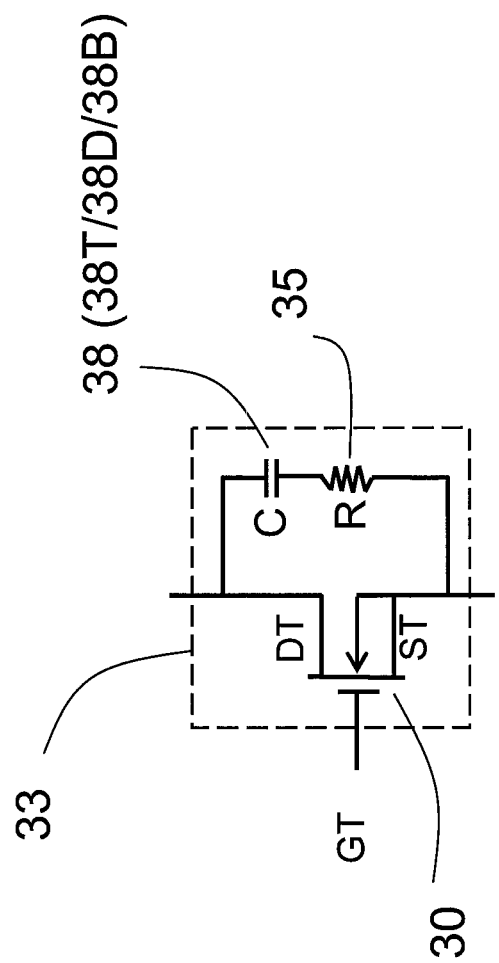
FIG. 12 shows the equivalent circuit of the package structure of FIGS. 10 & 11.

FIG. 12 shows the equivalent circuit of the package structure of FIG. 10 or FIG. 11. The capacitor 38 in FIG. 12 consists of the upper metal layer 38T, the dielectric material layer 38D and the metal base plate 38B and is located below the power device 30.

The package resin 33 covers and protects the power device 30, the capacitor 38 (including the upper metal layer 38T, the dielectric material layer 38D and the metal base plate 38B) and the resistor 35. One terminal of the capacitor 38 is electrically connected to the drain terminal DT of the power device 30, the other terminal of the capacitor 38 is electrically connected to one terminal of the resistor 35, and the other terminal of the resistor 35 is electrically connected to the source terminal ST of the power device 30.

Figure 13:
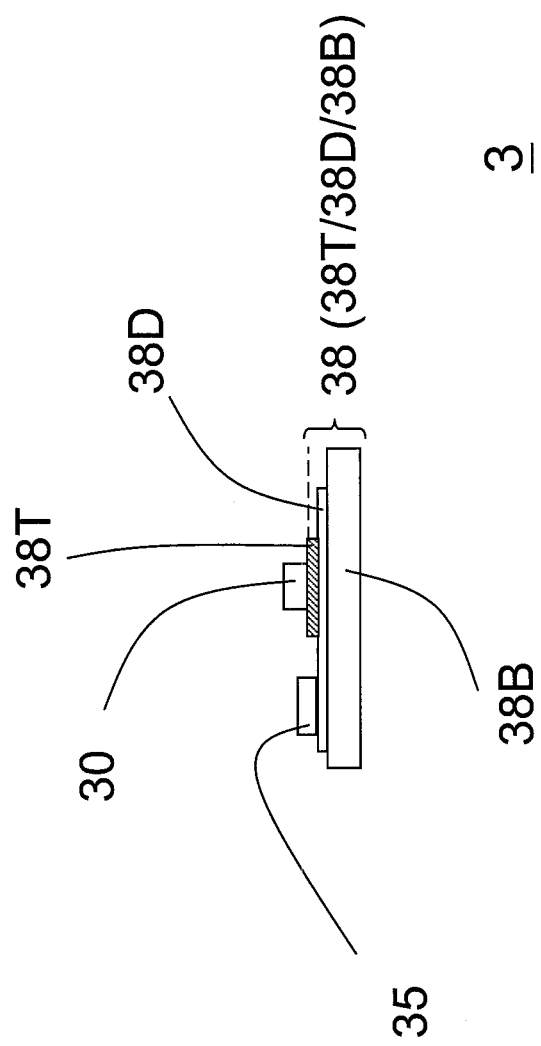
FIG. 13 is shown in a cross-sectional view of FIG. 11 along line C-C'.

FIG. 13 is shown in a cross-sectional view of FIG. 11 along line C-C'. The dielectric material layer 38D is disposed on the metal base plate 38B, the upper metal layer 38T is disposed on the dielectric material layer 38D, and the resistor 35 is disposed on the dielectric material layer 38D. The upper metal layer 38T, the dielectric material layer 38D and the metal base plate 38B together form a capacitor 38. The metal base plate 38B is used as the lower electrode (i.e. the lower metal layer) of the capacitor 38 and the base plate of the package structure 3. The upper metal layer 38T is electrically connected with one terminal of the resistor 35 through the wire 34, while the power device 30 is electrically connected to the other terminal of the resistor 35 through the wire 34.

Figure 14:
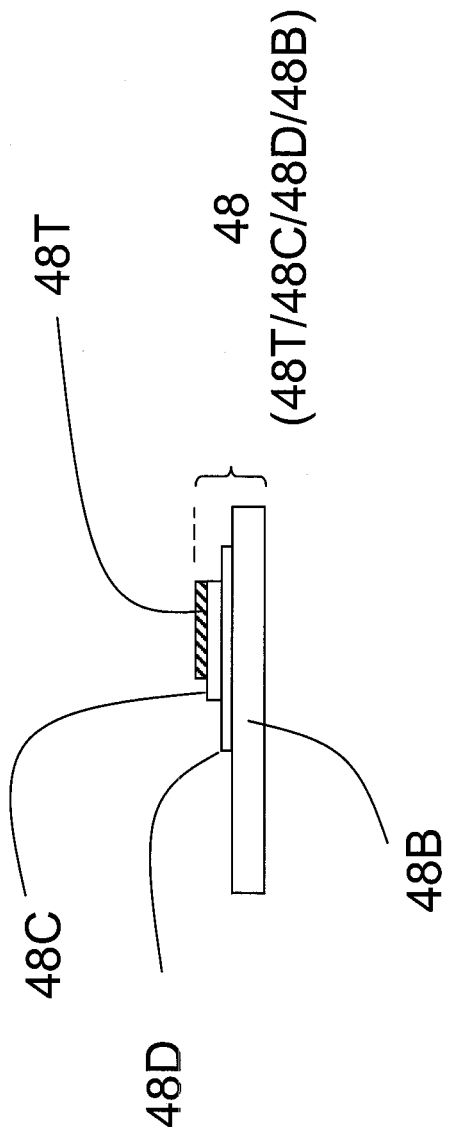
FIG. 14 illustrates an exemplary cross-sectional view of a power device package structure according to another embodiment of the disclosure.

FIG. 14 illustrates an exemplary cross-sectional view of a power device package structure according to another embodiment of the disclosure. The capacitor 48 further includes a conductive polymer layer 48C between the upper metal layer 48T and the dielectric material layer 48D to enhance the capacitance efficiency. The material of the conductive polymer layer 48C can be poly(3,4-ethylenedioxythiophene) (PEDOT), for example.

Figure 15:
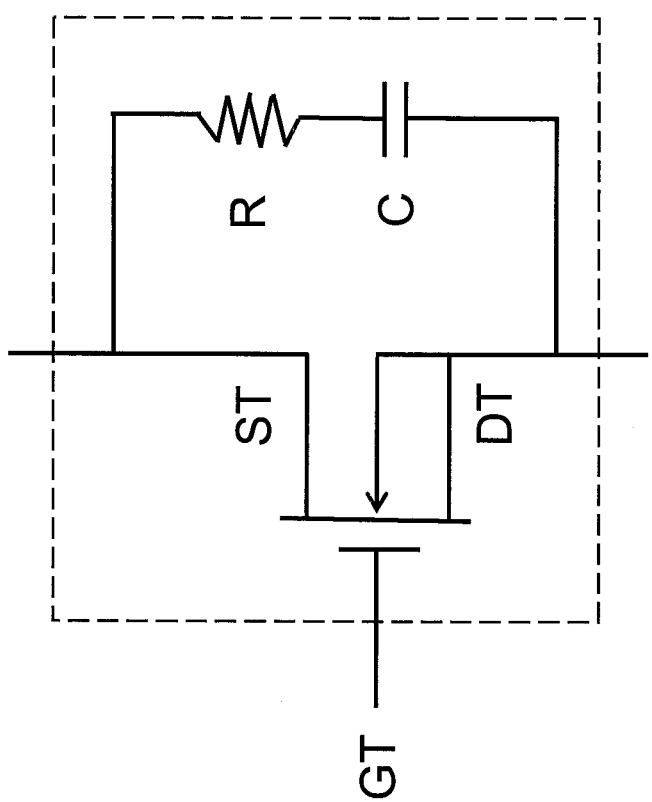
FIG. 15 shows the equivalent circuit of the package structure of the disclosure.

FIG. 15 shows the equivalent circuit of the modification of the package structure based on the circuit shown in FIG. 5 and FIG. 12. The connection relationship of the resistor R and the capacitor C can be switched by adjusting the relative positions or locations of the components in structural design. Such modification or adjustments is well understood and is encompassed within the protection scope of the disclosure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A power device package structure, comprising:
a metal base plate;
a dielectric material layer disposed on the metal base plate;
a resistor disposed on the dielectric material layer;
at least one power device disposed on the metal base plate, wherein the at least one power device has a gate terminal, a drain terminal and a source terminal; and
an upper metal layer disposed on the dielectric material layer, wherein the upper metal layer, the dielectric material layer and the metal base plate form a capacitor, and the resistor is electrically connected with the upper metal layer and the source terminal of the power device through wires, while the metal base plate is electrically connected to the drain terminal through another wire, wherein the dielectric material layer is located beside but separate from the power device, while the resistor is located beside but separate from the upper metal layer.

2. The structure of claim 1, further comprising an package resin covering and protecting the power device on the metal base plate, the upper metal layer, the dielectric material layer and the metal base plate, wherein a material of the package resin is epoxy resin.

3. The structure of claim 1, wherein the metal base plate includes a locking area, a central planar area and a central metal lead, and the central planar area is located between the locking area and the central metal lead, wherein the locking area has a hole and is exposed outside of the package resin, so as to lock the power device package structure to a printed circuit board, a base or a metal heat sink.

4. The structure of claim 1, wherein a first terminal of the capacitor is electrically connected to the drain terminal of the power device, a second terminal of the capacitor is electrically connected to a first terminal of the resistor, and a second terminal of the resistor is electrically connected to the source terminal of the power device.

5. The structure of claim 1, further comprising a conductive polymer layer between the upper metal layer and the dielectric material layer.

6. The structure of claim 3, further comprising a first metal lead and a second metal lead disposed respectively on both sides of the central metal lead and arranged coplanarly with the central metal lead, wherein the first and second metal leads and the central metal lead are individual and separate from one another.

7. The structure of claim 6, wherein the power device is disposed on the central planar area of the metal base plate, and has a gate terminal, a drain terminal and a source terminal electrically connected to the central metal lead, the first metal lead and the second metal lead respectively, through wires, wherein top surfaces of the first and second metal leads are coplanar with a top surface of the central metal lead.

8. A power device package structure, comprising:
a metal base plate;
a dielectric material layer disposed on the metal base plate;
a resistor disposed on the dielectric material layer;
an upper metal layer disposed on the dielectric material layer; and
at least one power device disposed on the upper metal layer, wherein the at least one power device has a gate terminal, a drain terminal and a source terminal, the upper metal layer, the dielectric material layer and the metal base plate form a capacitor, and the resistor is electrically connected with the upper metal layer and the source terminal of the power device through wires, the metal base plate is electrically connected to the drain terminal through another wire, and wherein the resistor is located beside but separate from the upper metal layer.

9. The structure of claim 8, further comprising an package resin covering and protecting the power device, the upper metal layer, the dielectric material layer and the metal base plate.

10. The structure of claim 8, wherein the metal base plate includes a locking area, a central planar area and a central metal lead, and the central planar area is located between the locking area and the central metal lead, wherein the locking area has a hole and is exposed outside of the package resin, so as to lock the power device package structure to a printed circuit board, a base or a metal heat sink.

11. The structure of claim 8, wherein a first terminal of the capacitor is electrically connected to the drain terminal of the power device, a second terminal of the capacitor is electrically connected to a first terminal of the resistor, and a second terminal of the resistor is electrically connected to the source terminal of the power device.

12. The structure of claim 8, further comprising a conductive polymer layer between the upper metal layer and the dielectric material layer.

13. The structure of claim 10, further comprising a first metal lead and a second metal lead disposed respectively on both sides of the central metal lead and arranged coplanarly with the central metal lead, wherein the first and second metal leads and the central metal lead are individual and separate from one another.

14. The structure of claim 13, wherein the power device is disposed in the central planar area of the metal base plate, and has a gate terminal, a drain terminal and a source terminal electrically connected to the central metal lead, the first metal lead and the second metal lead respectively, through wires, wherein top surfaces of the first and second metal leads are coplanar with a top surface of the central metal lead.

* * * * *